(12) United States Patent
Cho

(10) Patent No.: US 6,898,282 B2
(45) Date of Patent: May 24, 2005

(54) FLIP-TYPE TERMINAL WITH SLIM-STYLE MICROSTRIP PATCH ANTENNA FOR GPS AND METHOD THEREFOR

(75) Inventor: Pil-Jae Cho, Chongju-shi (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 503 days.

(21) Appl. No.: 09/757,994

(22) Filed: Jan. 10, 2001

(65) Prior Publication Data

US 2001/0008839 A1 Jul. 19, 2001

(30) Foreign Application Priority Data

Jan. 17, 2000 (KR) .......................................... 2000-1961

(51) Int. Cl.⁷ ............................. H04B 1/38; H04M 1/00
(52) U.S. Cl. ............................ 379/428.01; 455/575.1; 455/575.3; 455/575.7; 379/428.01
(58) Field of Search ............................... 455/95, 575.1, 455/575.3, 575.5, 575.7, 575.8, 90.3, 550.1, 552.1, 556.1; 379/428.01, 433.01, 433.1, 433.13

(56) References Cited

U.S. PATENT DOCUMENTS

| | | | | |
|---|---|---|---|---|
| 5,752,204 A | * | 5/1998 | Epperson et al. | ........ 455/575.7 |
| 6,230,028 B1 | * | 5/2001 | Shirakawa | ................... 455/566 |
| 6,243,592 B1 | * | 6/2001 | Nakada et al. | ........... 455/575.7 |
| 6,272,324 B1 | * | 8/2001 | Rudisill et al. | .......... 455/575.8 |
| 6,411,826 B1 | * | 6/2002 | Camp, Jr. | ................... 455/566 |

* cited by examiner

Primary Examiner—Simon Nguyen
(74) Attorney, Agent, or Firm—Cha & Reiter, L.L.C.

(57) ABSTRACT

A flip-type terminal and method therefor has mounted thereon a microstrip patch antenna for a GPS. The flip-type terminal comprises a body including a GPS receiver which is mounted to a main board; a flip having a slim-style microstrip patch antenna which is mounted to the flip in a manner such that a portion of the microstrip patch antenna projects out of the flip to define a rectangular contour; a hinge unit for mechanically connecting the body and the flip with each other, the hinge unit allowing the flip to be opened to and closed from a predetermined angle capable of rendering communication, the hinge unit further enabling the microstrip patch antenna to be opened to and closed from an optimal GPS data receiving angle; and an RF flexible printed circuit for electrically connecting the GPS receiver and the microstrip patch antenna with each other via the hinge unit.

20 Claims, 8 Drawing Sheets

FLIP-TYPE TERMINAL WITH SLIM-STYLE MICROSTRIP PATCH ANTENNA FOR GPS AND METHOD THEREFOR

CLAIM OF PRIORITY

This application makes reference to and claims all benefits accruing under 35 U.S.C. Section 119 from an application entitled, "Flip-Type Terminal with Slim-Style Microstrip Patch Antenna for GPS", filed in the Korean Industrial Property Office on Jan. 17, 1999 and there duly assigned Serial No. 2000-1961.

BACKGROUND OF THE INVENTION

1. Field of the Invention

The present invention relates to a flip-type terminal. More particularly, the present invention relates to a flip-type terminal which provides a global positioning system (GPS) service.

2. Description of the Related Art

Conventionally, a GPS provides an E911 service in which position information of a person is determined by receiving GPS satellite information. By determining the position information, the person's safety is increased through the use of a navigation system service, and other additional services which are widely used in the distribution industry or the leisure industry. For these GPS services, an antenna for the GPS is mounted to the conventional portable terminal. In the conventional art, an antenna for the GPS is mounted to a body of the portable terminal in a manner such that it projects from the body of the portable terminal.

Antennas for the GPS are divided into a ceramic patch antenna and a helix antenna. The ceramic patch antenna is formed by casing a ceramic patch of a rectangular parallelepiped shape with a plastic injection. The helix antenna is formed by twisting a feeder line path around a Teflon-based cylindrical member and then casing the cylindrical member with a plastic injection.

However, the conventional antennas constructed as mentioned above suffer from defects in that, since a size of a body of a terminal is to be increased due to a space which is occupied by the antenna, it is impossible to mount the antenna inside the body of the terminal. Even in the case that the antenna is mounted inside the body of the terminal, due to interference between the antenna and other components, it is difficult to align the antenna with a satellite so as to adequately receive a GPS satellite signal. As a consequence, while the conventional GPS antenna must be mounted externally of the body of the terminal, in the case that the antenna is applied to the terminal which is miniaturized and slimed, a size of the entire body cannot but be still increased. For this reason, inconvenience is induced in carrying the conventional terminal for the GPS, and at the same time, a limitation is imposed upon variously designing a terminal.

Among the conventional GPS antennas, the ceramic patch antenna, has a size of the patch is 25 mm×25 mm×4 mm, and the cylindrical helix antenna has a size is 50 mm×15 mm. It is therefore impossible to mount the conventional GPS antenna inside the body of the miniaturized terminal. Hence, as the conventional GPS antenna is mounted externally of the body of the terminal, it exerts an adverse influence on miniaturization and slimness of the body of the terminal.

Furthermore, if the portable terminal is inadvertently dropped, an antenna unit of the body, (more particularly, the GPS antenna) is easily damaged, whereby the terminal cannot properly provide a GPS service.

SUMMARY OF THE INVENTION

Accordingly, the present invention has been made in an effort to solve the problems occurring in the related art. An object of the present invention is to provide a flip-type terminal in which a microstrip patch antenna is mounted to a flip, thereby rendering miniaturization and slimness of a body of the flip-type terminal while maintaining receivability.

Another object of the present invention is to provide a flip-type terminal in which a microstrip patch antenna for a GPS is mounted to a flip, thereby allowing a user to enjoy a GPS service.

Still another object of the present invention is to provide a flip-type terminal which is automatically set to a GPS data receiving mode at an off-hook status and to a GPS data receiving standby mode at an on-hook status.

Yet still another object of the present invention is to provide a flip-type terminal which prevents an antenna for a GPS from being damaged even when the flip-type terminal falls out of the hand of a user.

In order to achieve the above object, according to the present invention, there is provided a flip-type terminal comprising: a body including a GPS receiver which is mounted to a main board; a flip having a slim-style microstrip patch antenna which is mounted to the flip in a manner such that a portion of the microstrip patch antenna projects out of the flip to define a rectangular contour; a hinge unit for mechanically connecting the body and the flip with each other, the hinge unit allowing the flip to be opened to and closed from a predetermined angle capable of rendering communication, the hinge unit further enabling the microstrip patch antenna to be opened to and closed from an optimal GPS data receiving angle; and an RF flexible printed circuit for electrically connecting the GPS receiver and the microstrip patch antenna with each other via the hinge unit.

In an embodiment of the present invention, a flip-type terminal comprises:

a body including a position sensing receiver which is mounted to a main board;

a flip adapted for attachment to the body;

a slim-style first microstrip patch antenna which is mounted to the flip so that a portion of the microstrip patch antenna projects out of the flip to define a rectangular contour;

a hinge means for mechanically connecting the body and the flip so that the flip is pivotable from: 1) an open position wherein the flip projects out from the body at a predetermined angle relative to the body which permits optimal position sensing communication by the microstrip patch antenna; and 2) a closed position wherein the flip is substantially parallel to the body so that the microstrip patch antenna is shielded between the flip and the body; and an RF flexible printed circuit for electrically connecting the position sensing receiver and the microstrip patch antenna so that the printed circuit flexes as the flip is moved between the closed position and the open position.

In a first aspect of the above embodiment of the present invention, the positioning sensing receiver may be GPS receiver.

In addition, the flip includes an upper part and a lower part, and the lower part is attached to the upper part through a double-sided tape. The upper part has a first antenna housing for mounting the microstrip patch antenna.

The first antenna housing may be integrally formed with the upper part of the flip.

The lower part of the flip may have a second antenna housing for mounting the microstrip patch antenna.

The second antenna housing is integrally formed with the lower part of the flip.

The lower part of the flip may further comprise an RF flexible printed circuit housing for mounting the RF flexible printed circuit, wherein the RF flexible printed circuit has a first end which is connected to the microstrip patch antenna by solder, and a second end which is connected to the GPS receiver by a connector.

In addition, the GPS receiver may be positioned adjacent to a lower end of the body.

In an embodiment, the hinge means pivotably connects the flip to the body at a lower end of the body.

A second aspect of the embodiment of the present invention includes that the flip-type terminal comprises a second antenna for transmitting and receiving wireless communications other than a GPS signal, the second antenna being arranged at an uppermost end of the body for transmitting and receiving wireless communications independent of a position and a communication status of the flip.

In addition, each of the first microstrip patch antenna and the second antenna may be adapted to respectively transmit and to respectively receive at frequencies which are different from each other.

Finally, the predetermined angle of the flip relative to the body in the open position is 130–150 degrees.

According to a method for providing a flip-type terminal of the present invention includes the steps of:

(a) providing a body including a position sensing receiver which is mounted to a main board, and a flip adapted for pivotable attachment to the body;

(b) mounting a slim-style microstrip patch antenna on a flip, so that a portion of the microstrip patch antenna projects out of the flip to define a rectangular contour;

(c) pivotably attaching the flip to the body by a hinge means so that the flip is pivotable from: 1) an open position wherein the flip projects out from the body at a predetermined angle relative to the body for permitting optimal position sensing communication by the microstrip patch antenna; and 2) a closed position wherein the flip is substantially parallel to the body so that the microstrip patch antenna is shielded between the flip and the body; and (d) connecting electrically the position sensing receiver and the microstrip patch antenna with an RF flexible printed so that the printed circuit flexes as the flip is moved between the closed position and the open position.

The position sensing receiver provided in step (a) may be a GPS receiver.

The flip provided in step (a) includes an upper part and a lower part, and the method further comprises (i) attaching the lower part to the upper part by a double-sided tape.

A first aspect of the above method includes (e) providing a second antenna signal which is arranged at an uppermost end of the body for transmitting and receiving wireless communications other than a positioning sensing signal, wherein the transmitting and receiving of wireless communications other than a positioning sensing signal of the second antenna being independent of a position and a communication status of the flip.

A second aspect of the above method includes:

(f) providing that the microstrip patch antenna and the second antenna are adapted to respectively transmit at different frequencies and to respectively receive at different frequencies from each other.

Finally, the predetermined angle in the open position of the pivotably attached flip relative to the body recited in step (c) is approximately 130–150 degrees.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE PREFERRED EMBODIMENT

Figure 1:
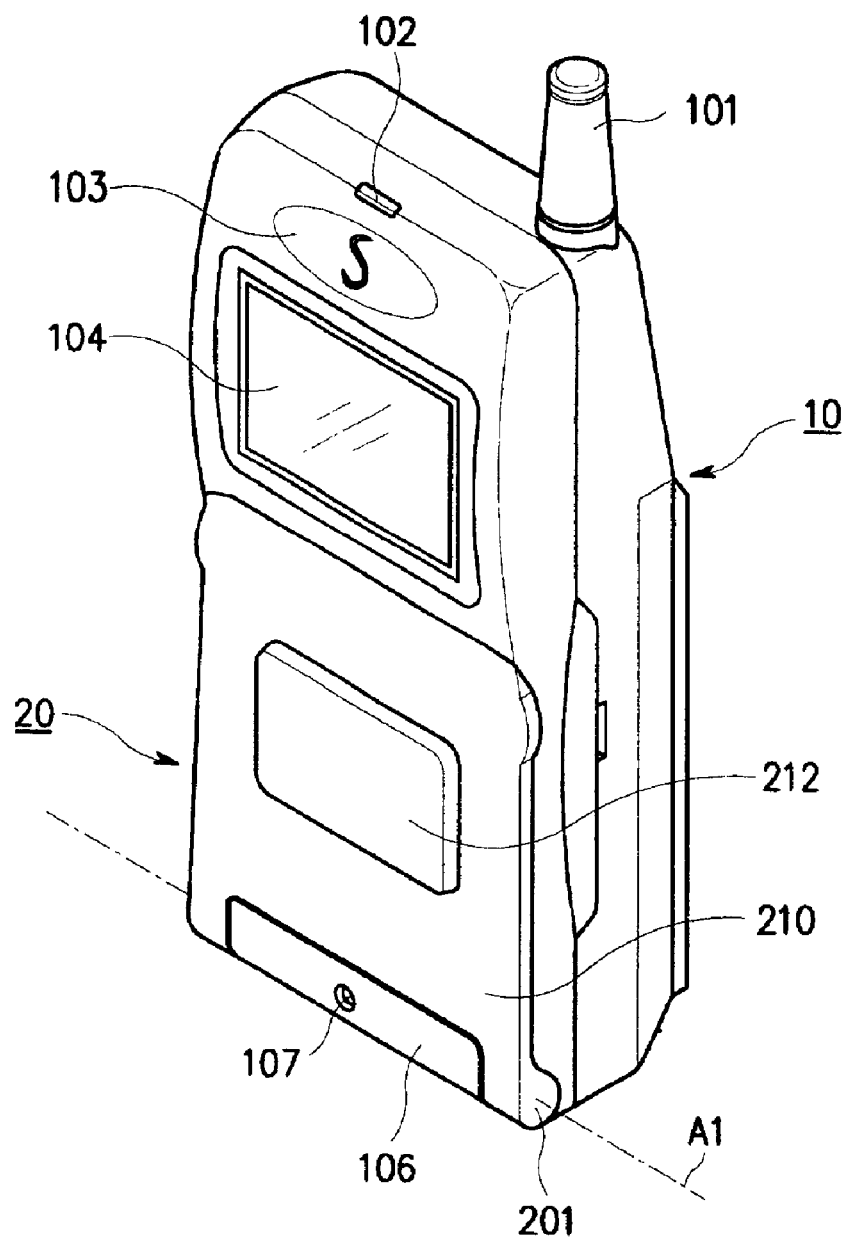
FIG. 1 is a perspective view illustrating a flip-type terminal having a microstrip patch antenna in accordance with a preferred embodiment of the present invention, wherein the fliptype terminal is in a GPS data receiving standby mode.

Reference will now be made in greater detail to the preferred embodiments of the present invention. In the drawings, the same or similar elements are denoted by the same reference numerals even though they are depicted in different drawings. For the purpose of clarity, a detailed description of known functions and configurations incorporated herein will be omitted when it may make the subject matter of the present invention rather unclear.

Figure 2:
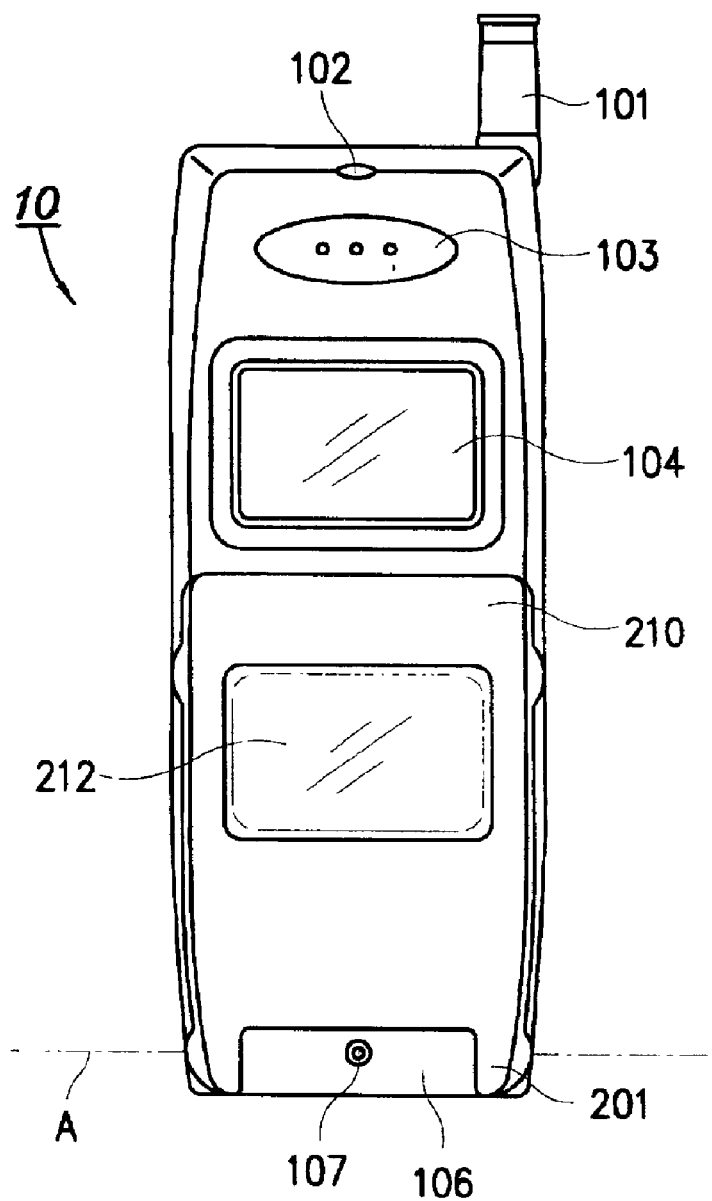
FIG. 2 is a front view of the flip-type terminal of FIG. 1.
Figure 3:
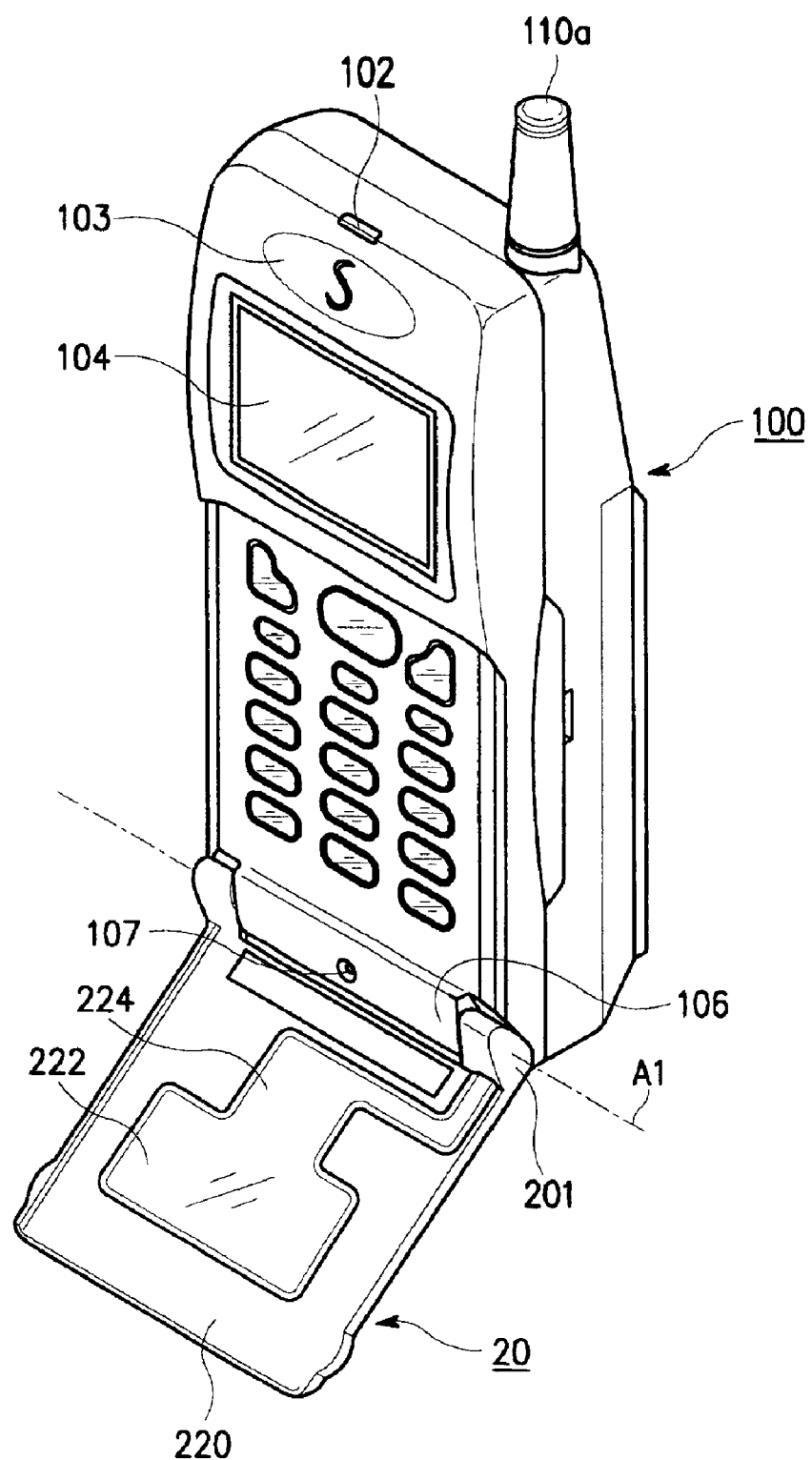
FIG. 3 is a perspective view illustrating the flip-type terminal having the microstrip patch antenna in accordance with the preferred embodiment of the present invention, wherein the flip-type terminal is in a GPS data receiving mode.
Figure 4:
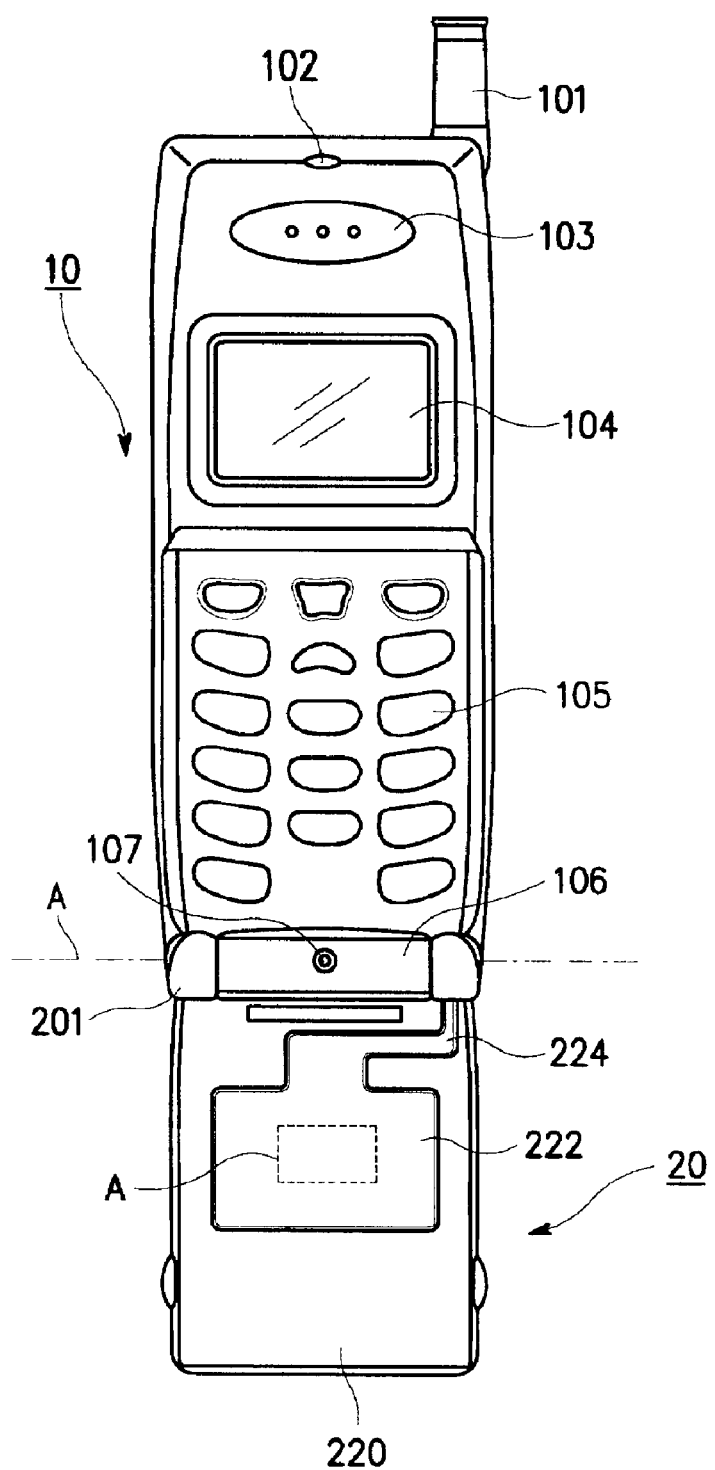
FIG. 4 is a front view of the flip-type terminal of FIG. 3.

FIGS. 1 and 2 illustrate a flip-type terminal having a microstrip patch antenna in accordance with a preferred embodiment of the present invention, wherein the flip-type terminal is in a GPS data receiving standby mode. FIGS. 3 and 4 illustrate the flip-type terminal having the microstrip patch antenna in accordance with the preferred embodiment of the present invention, wherein the flip-type terminal is in a GPS data receiving mode.

The flip-type terminal according to the present invention comprises a body 10, a flip 20, and a hinge unit (not shown) which mechanically connects the body 10 and the flip 20 with each other and thereby allows the flip 20 to be opened to and closed from a predetermined angle capable of rendering communication. The flip 20 is opened around a rotating shaft A1 by an angle of about 130–150° from the body 10. An opening angle of the flip 20 can be variously established.

The body 10 includes an antenna unit 101 which is arranged at an uppermost position of the body, a telephone signal reception indicator lamp 102 which is positioned below the antenna unit 101, an earpiece 103, an LCD module 104, a plurality of keys 105 (shown in FIG. 5), and a microphone unit 107 which is arranged lowermost. A hinge arm 106 is formed at a lower end of the body 10, and the hinge unit is accommodated in the hinge arm 106. The flip 20 is coupled to the hinge unit to be opened to and closed from the predetermined angle capable of rendering communication. The flip 20 has a pair of hinge sockets 201 which are oppositely arranged to each other to be hingedly coupled to the hinge unit which is accommodated in the hinge arm 106, while being centered around the rotating shaft A1. The flip 20 functions to protect the keys 105 and prevent the keys 105 from being unintensionally pressed, and serves as a sound reflecting plate.

The flip 20 according to the present invention includes a microstrip patch antenna A used for providing a GPS service. The microstrip patch antenna A will be described later in detail with reference to FIG. 8. Hereinbelow, a structure for mounting the microstrip patch antenna A to the flip 20 will be described.

Figure 5:
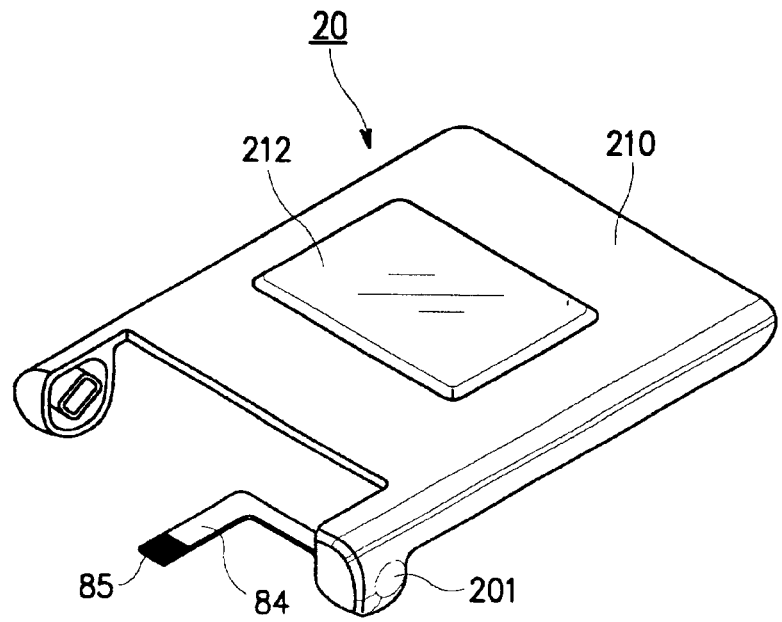
FIG. 5 is a perspective view illustrating a flip to which the microstrip patch antenna in accordance with the preferred embodiment of the present invention is mounted.
Figure 6:
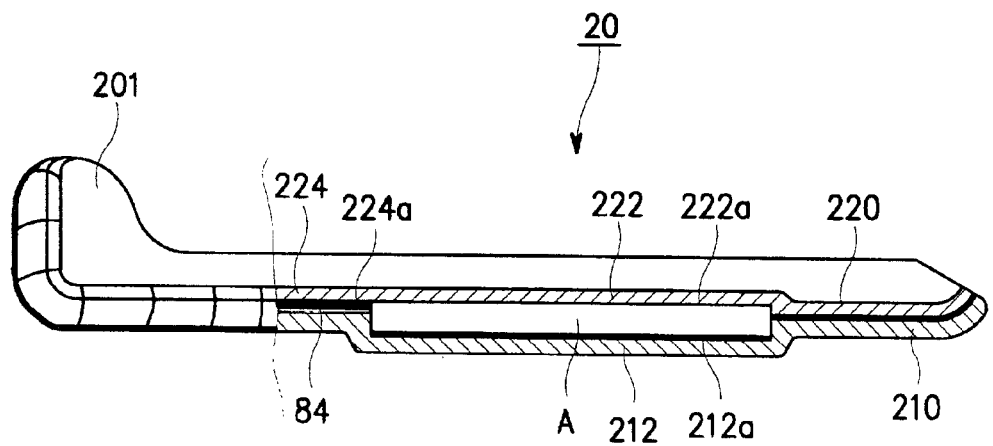
FIG. 6 is a cross-sectional view of the flip shown in FIG. 5.

Referring to FIGS. 5 and 6, the flip 20 according to the present invention includes an upper flip part 210 and a lower flip part 220 for mounting the microstrip patch antenna A thereto. The upper flip part 210 and the lower flip part 220 are integrally attached to each other using a double-sided tape. The upper flip part 210 has a first antenna housing 212, and the lower flip part 220 has a second antenna housing 222. The first antenna housing 212 is integrally formed with the upper flip part 210 upon injection-molding the upper flip part 210. The second antenna housing 222 is integrally formed with the lower flip part 220 upon injection-molding the lower flip part 220. Also, the lower flip part 220 further has a flexible printed circuit housing 224 for mounting an RF flexible printed circuit 84. The flexible printed circuit housing 224 is integrally formed with the lower flip part 220 upon injection-molding the lower flip part 220.

In order to mount the microstrip patch antenna A to the flip 20, a pair of grooves 212a, 222a for accommodating the microstrip patch antenna A are defined in the upper and lower flip parts 210 and 220, respectively. By this, the first and second antenna housings 212 and 222 project from surfaces of the upper and lower flip parts 210 and 220. Another groove 224a is defined in the lower flip part 220 for mounting the flexible printed circuit 84 to the flip 20, and thereby, the flexible printed circuit housing 224 projects from a surface of the lower flip part 220 by about 1 mm.

Figure 7:
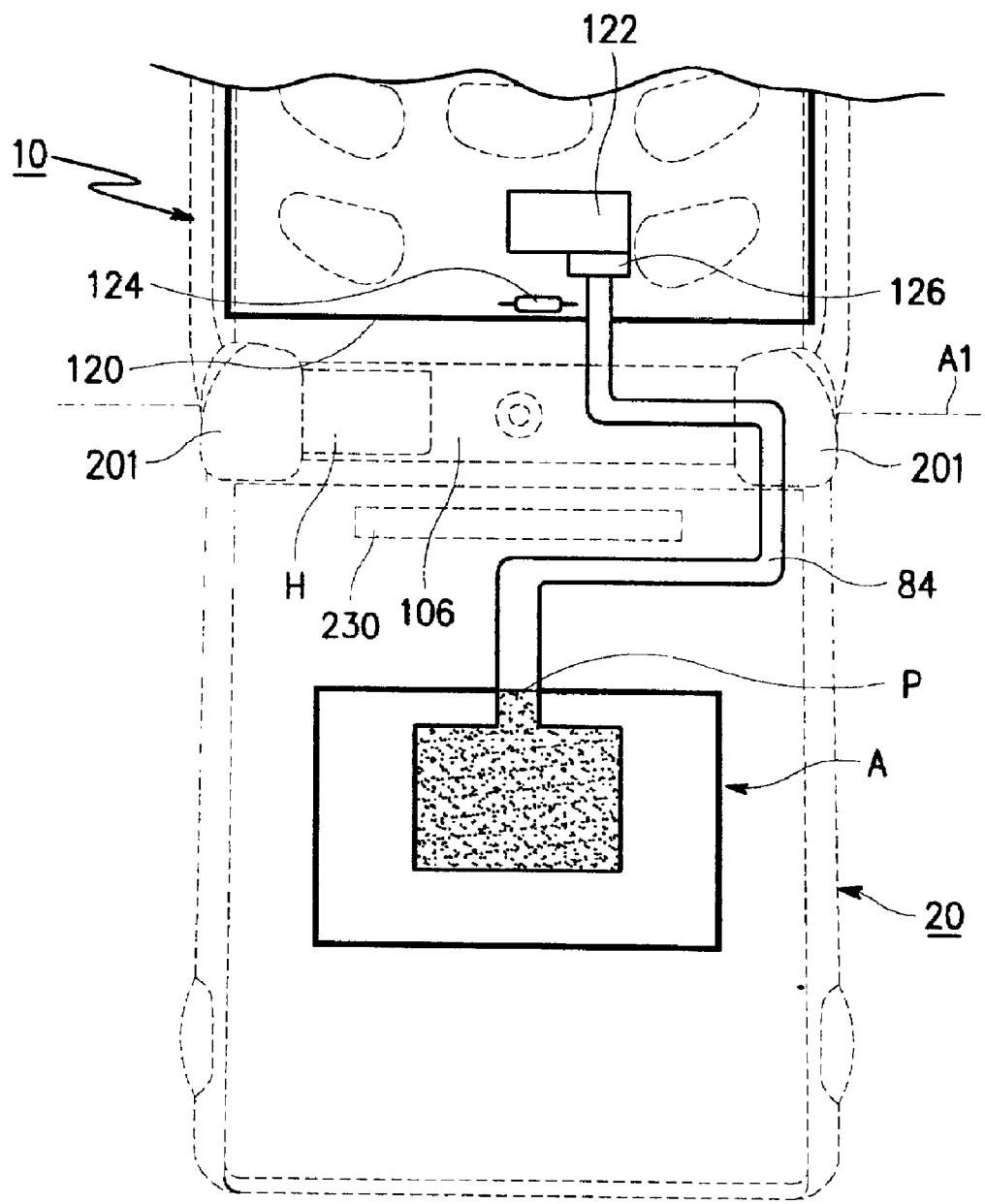
FIG. 7 is a schematic plan view illustrating a state wherein the microstrip patch antenna according to the present invention is connected to a body.

FIG. 7 is a view illustrating a structure for electrically connecting the microstrip patch antenna A mounted to the flip 20, to a GPS receiver 122 which is disposed inside the body 10. Referring to FIG. 7, the microstrip patch antenna A which is provided to the flip 20, is connected to the GPS receiver 122 which is mounted to a main board 120, using the RF flexible printed circuit 84. The flexible printed circuit 84 has one end which is connected to the microstrip patch antenna A by proper means such as soldering (thereby constituting a power supply section) and the other end which is connected to a connector 126 of the GPS receiver 122. The connector 126 is detachably configured. At this time, the flexible printed circuit 84 passes through the rotating shaft A1 which is positioned at the lower end of the body 10. One end of the hinge arm 106 of the body 10, in which the hinge unit H is accommodated, is coupled to one hinge socket 201 of the flip 20, and the other end of the hinge arm 106 of the body 10, in which a hollow shaft (not shown) is formed, is coupled to the other hinge socket 201 of the flip 20. In other words, the flexible printed circuit 84 is connected to the GPS receiver 122 through a hole which is defined in the hollow shaft.

When the flip 20 is opened from and closed to the body 10, because the flexible printed circuit 84 passes through the hole which is defined in the hollow shaft, the rotating movement of the flip 20 is not interfered with.

In the present invention, while it is preferable that the RF flexible printed circuit 84 be used as means for electrically connecting the microstrip patch antenna A and the GPS receiver 122 with each other, the means is not limited only to the RF flexible printed circuit 84. For example, a cable can be used as the electrical connection means.

On the other hand, in order that the flip 20 is opened from the body 10, a lead switch 124 and a magnet 230 are symmetrically arranged with each other while being centered around the rotating shaft A1, and the GPS receiver 122 is positioned adjacent to a lower end of the body 10.

Figure 8:
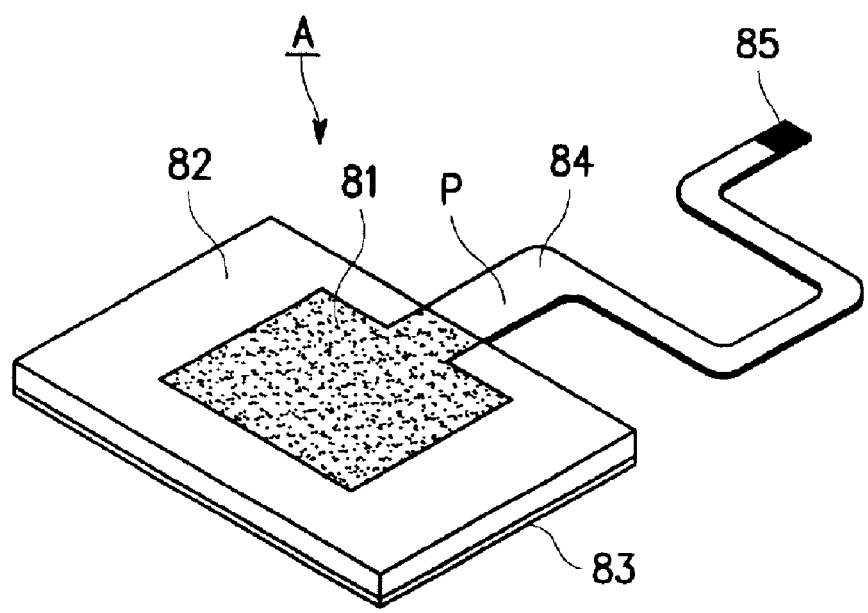
FIG. 8 is a perspective view illustrating an independent appearance of the microstrip patch antenna.

FIG. 8 is a perspective view illustrating an independent appearance of the microstrip patch antenna A which is mounted to the flip 20 according to the present invention. As shown in FIG. 8, an antenna such as the microstrip patch antenna A which is mounted to the flip 20 according to the present invention, is disclosed in U.S. Pat. No. 5,903,239 entitled "Micro-Patch Antenna Connected to Circuits Chips", U.S. Pat. No. 5,870,057 entitled "Small Antenna Such As Microstrip Patch Antennas, and U.S. Pat. No. 5,955,994 entitled "Microstrip Antenna", the contents of these documents are hereby incorporated by reference as background material.

The micro strip patch antenna A (according to this embodiment of the present invention) has a dielectric constant of 10.2 and a thickness of 1.3 mm, and is formed as a flexible DUROID substrate which is made by the fact that each of both sides of a dielectric substrate 82 is printed with a ground plate 83. The dielectric substrate 82 is cut to a size of 20 mm×30 mm, and, in order to resonate an upper surface of the ground plate 83 at a GPS frequency of 1.575 MHz, is formed with a strip line 81 serving as a feeder line path having a proper configuration. At this time, the opposite surface is used as a ground surface to stabilize a radiation characteristic. It is to be noted as an important factor upon fabricating the microstrip patch antenna for the GPS that the dielectric substrate 82 be cut to have an accurate size and the strip line 81 serving as the feeder line path be formed with a high precision.

The RF flexible printed circuit (or an RF cable) 84 which is used for electrically connecting the microstrip patch antenna A to the GPS receiver 122 of the body 10, has a possible shortest length for minimizing damage. To this end, the GPS receiver 122 is positioned adjacent to the lower end of the body 10. Also, a feeding point P of the microstrip patch antenna A and the feeder line of the RF flexible printed circuit 84 are connected with each other by soldering. In order to avoid radio interference and stabilize the radiation characteristic, a ground wire of the RF flexible printed circuit 84 is connected with the ground plate 83 of the microstrip patch antenna A by soldering.

Figure 9:
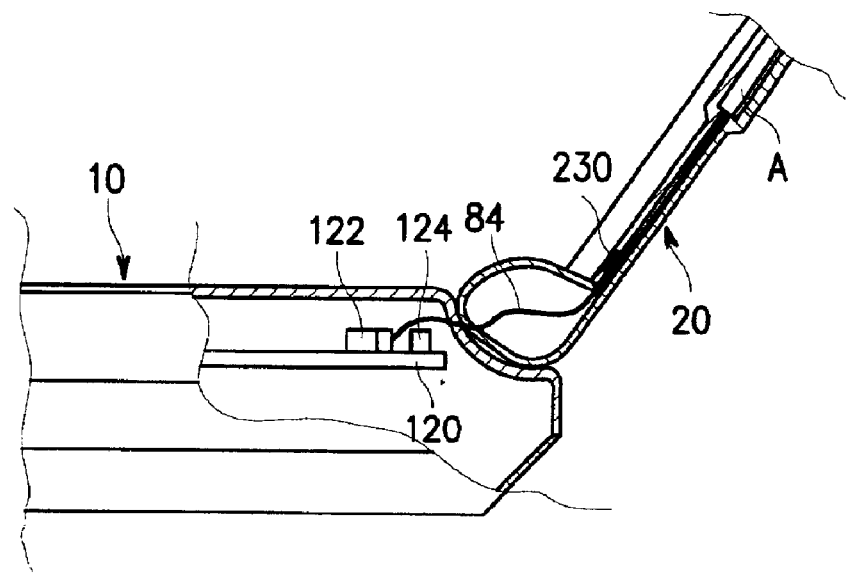
FIG. 9 is a partially broken-away side view illustrating the flip-type terminal having the microstrip patch antenna in accordance with the preferred embodiment of the present invention, wherein the flip-type terminal is in the GPS data receiving mode.
Figure 10:
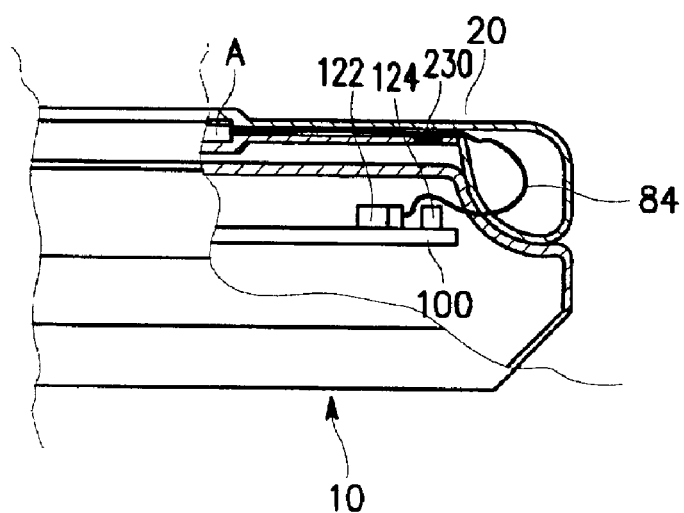
FIG. 10 is a partially broken-away side view illustrating the flip-type terminal having the microstrip patch antenna in accordance with the preferred embodiment of the present invention, wherein the flip-type terminal is in the GPS data receiving standby mode.

Hereinafter, operations of the microstrip patch antenna A according to the present invention will be described in detail with reference to FIGS. 9 and 10. Generally, an on-hook status of the terminal means a communication standby mode wherein communication cannot be implemented, and an off-hook status of the terminal means a communication mode wherein communication can be implemented. In order to effect a mode conversion between the on-hook status and the off-hook status, the body 10 has the lead switch 124 which is mounted to the main board 120, and the magnet 230 is mounted to the flip 20. When the terminal is maintained at the on-hook status, the lead switch 124 and the magnet 230 are closely positioned to each other, and when the terminal is maintained at the off-hook status, the lead switch 124 and the magnet 230 are separated from each other. In this way, the mode conversion between the on-hook status and the off-hook status is effected.

When a user enjoys the GPS service employing the GPS terminal or the terminal having a GPS function, if the flip 20 is opened, assuming that the terminal is set to an automatic GPS data receiving mode, the GPS function is automatically operated to seek after a satellite and receives GPS data through the microstrip patch antenna A in a state wherein an angle of the terminal is properly established depending upon an environment. At this time, in the case of the GPS terminal, if a telephone call is received while the user enjoys the GPS service, the telephone call is first managed.

In the meanwhile, in the case that the terminal is set to a manual GPG data receiving mode, the flip 20 is opened and the a GPS hot key (not shown) is pressed, to initiate the GPS service. At this time, an angle of the micro strip patch antenna A which is mounted to the flip 20, is adjusted to enable the microstrip patch antenna A to be best aligned with the satellite. In the case that the terminal is to be carried by a user, in the automatic GPS data receiving mode, by simply closing the flip 20, the GPS function is stopped, and in the manual GPS data receiving mode, by pressing again the GPS hot key, the GPS function is stopped and then the flip 20 is closed.

In addition, in the flip-type terminal, the hinge unit which mechanically connects the body and the flip with each other to enable the flip to be opened to and closed from the predetermined angle capable of rendering communication, can be realized in a variety of ways, thereby to variously adjust an opening or closing amount of the flip. Accordingly, in the present invention, it is preferred that, by calculating an opening angle which can optimize the operation of the microstrip patch antenna, the opening or closing amount of the flip is established.

Meanwhile, a person skilled in the art will readily appreciate that the present invention can be applied not only to the flip-type terminal, but also to a folder-type terminal. For example, in a folder-type terminal which includes a body, a folder and a hinge unit for mechanically connecting the body and the folder, a microstrip patch antenna can be mounted to the folder and a GPS receiver can be mounted inside the body.

As described above, the flip-type terminal according to the present invention, constructed as mentioned above, provides advantages in that, since a GPS antenna is mounted to a flip of the terminal, miniaturization, slimness and lightweight of a body of the terminal can be accomplished. Moreover, portability of a terminal is improved according to the present invention. Furthermore, due to the fact that the body of the terminal can be designed in various ways in obedience to an intension of a designer, it is possible to provide a diversity of designs. Also, because the microstrip patch antenna is made from a soft material, even in the case that the terminal is inadvertently dropped, the terminal is prevented from being damaged.

While this invention has been described in connection with what is presently considered to be the most practical and preferred embodiment, it is to be understood that the invention is not limited to the disclosed embodiment, but, on the contrary, it is intended to cover various modifications within the spirit and scope of the appended claims. For example, the GPS receiver described above is for explanatory purposes, and any position sensing system which transmits at frequencies which can be transmitted and received using a microstrip patch antenna is within the scope of the present invention.

What is claimed is:

1. A flip-type terminal comprising:
    a body including a position sensing receiver, which is mounted to a main board, positioned adjacent to a lower end of the body and a switch mounted thereof;
    a flip having a magnetic element adapted for attachment to said body;
    a slim-style first microstrip patch antenna which is mounted to said flip so that a portion of the microstrip patch antenna projects out of said flip to define a rectangular contour;
    a hinge means for mechanically connecting said body and said flip so that said flip is selectively pivotable from:
    1) an open position wherein said flip projects out from the body at a predetermined angle relative to the body so that said switch is separated from said magnetic element, thus permitting optimal position sensing communication by the microstrip patch antenna; and 2) a closed position wherein said flip is substantially parallel to said body so that said magnetic element comes in substantially close contact with said switch, thus shielding the microstrip patch antenna between said flip and said body;
    an RF flexible printed circuit having a ground wire for electrically connecting the position sensing receiver and a round plate of the microstrip patch antenna so that the printed circuit flexes as said flip is moved between the closed position and the open position; and
    a controller for managing an incoming call when the flip-terminal is in the open position.

2. The flip-type terminal according to claim 1, wherein the positioning sensing receiver is a GPS receiver.

3. The flip-type terminal according to claim 2, wherein the GPS receiver is positioned adjacent to a lower end of the body.

4. The flip-type terminal according to claim 2, wherein the RF flexible printed circuit has a first end which is connected to the microstrip patch antenna by solder, and a second end which is connected to the GPS receiver by a connector.

5. The flip-type terminal according to claim 1, wherein said flip includes an upper part and a lower part, and said lower part is attached to the upper part through a double-sided tape.

6. The flip-type terminal according to claim 5, wherein the upper part has a first antenna housing for mounting the microstrip patch antenna.

7. The flip-type terminal according to claim 6, wherein the first antenna housing is integrally formed with the upper part of said flip.

8. The flip-type terminal according to claim 5, wherein the lower part of said flip has a second antenna housing for mounting the microstrip patch antenna.

9. The flip-type terminal according to claim 8, wherein the second antenna housing is integrally formed with the lower part of said flip.

10. The flip-type terminal according to claim 5, wherein the lower part of said flip further comprises an RF flexible printed circuit housing for mounting the RF flexible printed circuit.

11. The flip-type terminal according to claim 1, wherein the hinge means pivotably connects said flip to said body at a lower end of said body.

12. The flip-type terminal according to claim 11, further comprising a second antenna for transmitting and receiving wireless communications other than a GPS signal, said second antenna being arranged at an uppermost end of said body for transmitting and receiving wireless communications independent of a position and a communication status of said flip.

13. The flip-type terminal according to claim 12, wherein each of said first microstrip patch antenna and said second antenna are adapted to respectively transmit and to respectively receive at frequencies which are different from each other.

14. The flip-type terminal according to claim 1, wherein the predetermined angle of said flip relative to said body in the open position is 130–150 degrees.

15. A method for providing a flip-type terminal comprising the steps of:
  (a) providing a body including a position sensing receiver, which is mounted to a main board, positioned adjacent to a lower end of the body and a flip having a magnetic element adapted for pivotable attachment to said body and a switch mounted therefrom;
  (b) mounting a slim-style microstrip patch antenna on a flip, so that a portion of the microstrip patch antenna projects out of said flip to define a rectangular contour;
  (c) pivotably attaching the flip to said body by a hinge means so that said flip is selectively pivotable from: 1) an open position wherein said flip projects out from said body at a predetermined angle relative to said body so that said switch is separated from said magnetic element thus permitting optimal position sensing communication by the nucrostrip patch antenna; and 2) a closed position wherein said flip is substantially parallel to said body so that said magnetic element comes in substantially close contact with said switch, thus shielding the microstrip patch antenna between said flip and said body; and
  (d) electrically coupling the position sensing receiver and a round plate of the microstrip patch antenna with an RF flexible printed circuit having a ground wire so that said printed circuit flexes as said flip is moved between the closed position and the open position, wherein an incoming call is managed while the terminal is in the open position.

16. The method according to claim 15, wherein the position sensing receiver provided in step (a) is a GPS receiver.

17. The method according to claim 15, wherein the flip provided in step (a) includes an upper part and a lower part, and said method further comprises (i) attaching said lower part to the upper part by a double-sided tape.

18. The method according to claim 15, further comprising:
  (e) providing a second antenna signal which is arranged at an uppermost end of said body for transmitting and receiving wireless communications other than a positioning sensing signal, wherein the transmitting and receiving of wireless communications other than a positioning sensing signal of said second antenna being independent of a position and a communication status of said flip.

19. The method according to claim 18, further comprising:
  (f) providing that said microstrip patch antenna and said second antenna are adapted to respectively transmit at different frequencies and to respectively receive at different frequencies from each other.

20. The method according to claim 15, wherein the predetermined angle in the open position of the pivotably attached flip relative to the body recited in step (c) is approximately 130–150 degrees.

* * * * *